US007348496B2

(12) United States Patent
Wermer et al.

(10) Patent No.: US 7,348,496 B2
(45) Date of Patent: *Mar. 25, 2008

(54) CIRCUIT BOARD WITH ORGANIC DIELECTRIC LAYER

(75) Inventors: Paul H. Wermer, San Francisco, CA (US); Brian Kaiser, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/003,956

(22) Filed: Dec. 3, 2004

(65) Prior Publication Data

US 2005/0099762 A1 May 12, 2005

Related U.S. Application Data

(62) Division of application No. 10/419,400, filed on Apr. 21, 2003, now Pat. No. 6,829,133, which is a division of application No. 09/733,484, filed on Dec. 8, 2000, now Pat. No. 6,605,551.

(51) Int. Cl.
*H05K 1/16* (2006.01)

(52) U.S. Cl. ............ 174/260; 174/261; 174/262

(58) Field of Classification Search .......... 174/262, 174/260, 255, 256, 261, 265, 257; 361/792, 361/793, 794, 795, 760, 761, 765
See application file for complete search history.

(56) References Cited

U.S. PATENT DOCUMENTS 3,740,678 A * 6/1973 Hill .................. 333/238
4,170,819 A * 10/1979 Peter et al. ............ 29/853
5,212,283 A * 5/1993 St. Clair .............. 528/353
5,421,083 A * 6/1995 Suppelsa et al. ........ 29/852
5,601,684 A * 2/1997 Shiga ................ 156/278
5,614,765 A   3/1997 Avanzino et al.
5,689,091 A * 11/1997 Hamzehdoost et al. .... 174/255
5,741,721 A   4/1998 Stevens (Continued)

FOREIGN PATENT DOCUMENTS

JP      410283841 A   * 10/1998

OTHER PUBLICATIONS

Nelms, D., et al., "Anodization for Forming Thin Film Embedded Capacitors in MCM-D and MCM-L Substrates", *Proceedings of the 48th Electronic Components & Technology Conference*, Seattle, WA,(May 1998),pp. 247-251.

(Continued)

*Primary Examiner*—Ishwar (I. B.) Patel
(74) *Attorney, Agent, or Firm*—Schwegman, Lundberg & Woessner, P.A.

(57) ABSTRACT

Embodiments of the present invention include forming a thin, conformal, high-integrity dielectric coating between conductive layers in a via-in-via structure in an organic substrate, using an electrocoating process to reduce loop inductance between the conductive layers. The dielectric coating is formed using a high dielectric constant material such as an organic polymer or an organic polymer mixture. Embodiments of the present invention also include forming a thin, dielectric coating between conductive layers on a substantially planar substrate material and providing an embedded capacitor to reduce loop inductance.

10 Claims, 4 Drawing Sheets

U.S. PATENT DOCUMENTS

| | | | |
|---|---|---|---|
| 5,774,336 A * | 6/1998 | Larson | 361/720 |
| 5,838,549 A * | 11/1998 | Nagata et al. | 361/794 |
| 5,880,018 A | 3/1999 | Boeck et al. | |
| 5,949,030 A * | 9/1999 | Fasano et al. | 174/262 |
| 6,096,411 A * | 8/2000 | Nakatani et al. | 428/209 |
| 6,124,626 A | 9/2000 | Sandhu et al. | |
| 6,278,153 B1 | 8/2001 | Kikuchi et al. | |
| 6,538,300 B1 | 3/2003 | Goldberger et al. | |
| 6,829,133 B2 | 12/2004 | Wermer et al. | |

OTHER PUBLICATIONS

Nishitsuji, M., et al., "Advanced GaAs-MMIC Process Technology Using High-Dielectric Constant Thin Film Capacitors by Low-Temperature RF Sputtering Method", *15th Annual GaAs IC Symposium, Technical Digest*, (Oct. 1993),pp. 329-332.

Stauf, G. T., et al., "Thin Film High K Dielectrics for Integrated Passive Devices", *The International Journal of Microcircuits & Electronic Packaging*, 20 (2), (1997),pp. 75-80.

* cited by examiner

CIRCUIT BOARD WITH ORGANIC DIELECTRIC LAYER

This application is a divisional of U.S. application Ser. No. 10/419,400 filed Apr. 21, 2003, now U.S. Pat. No. 6,829,133 which is a divisional of U.S. patent application Ser. No. 09/733,484, filed Dec. 8, 2000, now U.S. Pat. No. 6,605,551 which are incorporated herein by reference in its entirety.

TECHNICAL FIELD

Embodiments of the present invention relate generally to a multilayered organic substrate material used as a support substrate for electronic components and, more particularly, to forming a dielectric layer on the multilayered organic substrate material.

BACKGROUND

Electrical circuits, which may include electronic components, such as integrated circuits(ICs), resistors, capacitors, and inductors, are often supported by organic substrates. The organic substrates may also support conductive traces for conveying electric current to the terminals of the electronic components. Multilayer substrates include alternating layers of conductive and organic materials. The conductive layers comprise conductive traces interconnecting the electronic components. The conductive layers may be electrically interconnected by means of conductive vertical interconnects, such as vias that pass through adjacent organic layers of the multilayer structure or by electrically conductive vias such as plated through holes that pass through the entire substrate, and are electrically continuous with selected conductive layers. The organic layers often serve as dielectric layers on the multilayered substrates that support electronic components.

In some power delivery applications, it may be desirable to have low loop inductance between the conductive traces. For example, in a multilayer substrate, some conductive layers of the substrate may serve as power planes, and others may serve as ground planes, depending on the operational requirement of the application. In such cases it may be desirable for the power delivery current loop to have low inductance. For example, in the case of high speed microprocessors, the rapid switching of transistors can cause large transient voltage drops in the power supply voltage, if the inductance of the power delivery loop is too high. These voltage drops can significantly degrade the microprocessors' speed and performance.

In general, the loop inductance between conductive layers in a multilayer organic substrate depends on the thickness of the dielectric layer formed between the two conductive layers. As the thickness of the dielectric layer increases, the loop inductance between the two conductive layers increases. In general, the loop inductance of a conductive path is related to the cross-sectional area between power delixery and ground return paths. In the case of a multilayer organic substrates this cross-sectional area depends on the thickness of the dielectric layer separating power and ground planes, and on the spacing between vias or through-vias (plated-through vias) that make connections between layers in the multilayer organic substrate. Therefore, to achieve lower loop inductance between conductive layers in a multilayer organic substrate, the thickness of the dielectric layer formed between conductive traces has to be reduced.

The thickness of the dielectric layer formed on a flat multilayered substrate using present fabrication techniques, such as liquid coating and dry film laminations, is about 20 microns or higher. In contrast, the thickness of the dielectric layer formed in a through-via using current fabrication techniques, such as a double-drilling process, is in the range of about 75 to 100 microns. Reducing the thickness of the dielectric layer, lower than 20 microns if formed on a flat surface and lower than 75 microns if formed in a through-via, increases the risk of having pin holes and step coverage problems in the dielectric layer. Pin holes and step coverage problems in the dielectric layer can result in shorts between the two conductive traces during operation. Pin holes are microscopic holes in the dielectric layer that can become filled with conductive material, resulting in shorts between power and ground planes during operation. Step coverage is a measure of how conformal the coating is. If step coverage is poor, extreme thinning of the dielectric can occur at sharp edges, such as at the corners of conductive traces. Both pin holes and step coverage problems can cause low manufacturing yields and can be points of failure in the field, resulting in reliability problems.

Therefore, there is a need in some power delivery applications for an improved fabrication technique that provides a thinner dielectric layer free from pin holes and step coverage problems to achieve lower loop inductance values between conductive layers in a multilayered organic substrate.

DETAILED DESCRIPTION

Figure 1:
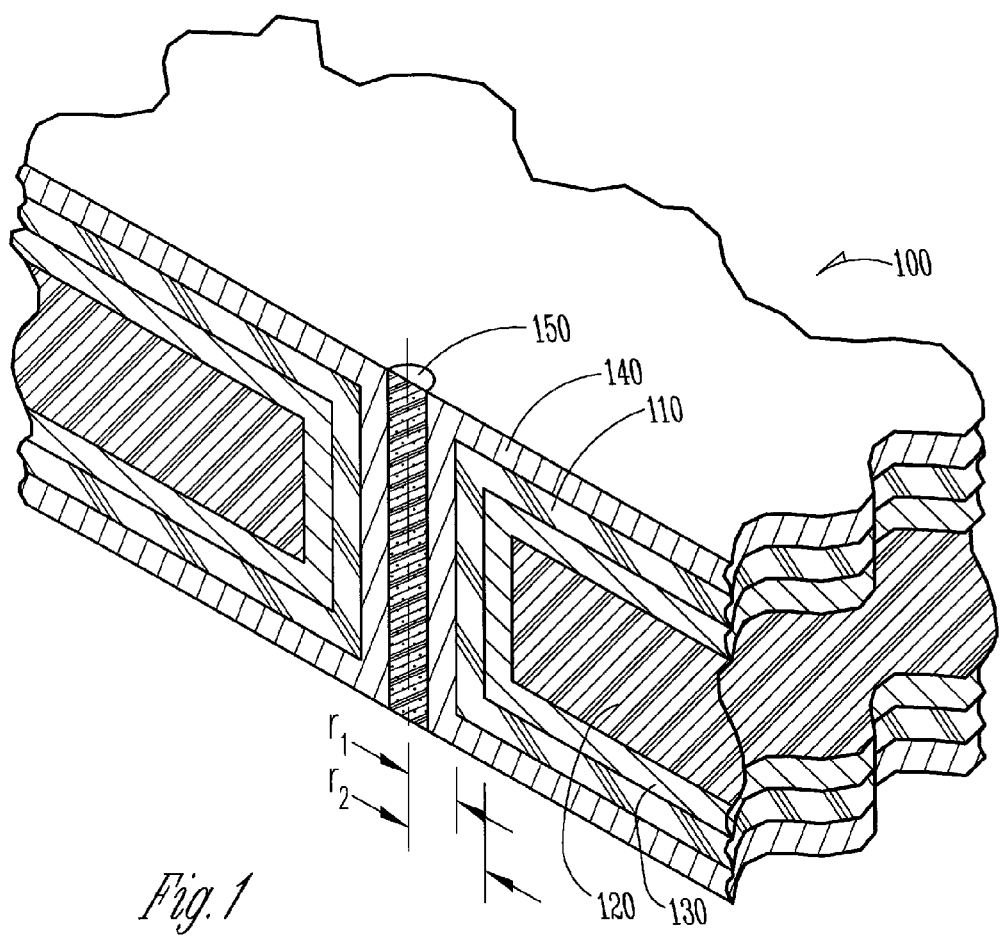
FIG. 1 shows a sectional view of a dielectric layer formed in a through-via-in-via structure according to an embodiment of the present invention.

In the following detailed description of the embodiments, reference is made to the accompanying drawings that show, by way of illustration, specific embodiments in which the invention may be practiced. These embodiments are described in sufficient detail to enable those skilled in the art to understand and practice them. Other embodiments may be utilized, and structural, logical, and electrical changes may be made without departing from the scope of the present disclosure. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of embodiments of the present invention are defined only by the appended claims, along with the full scope of equivalents to which such claims are entitled.

The terms "coatings" and "layers" are often used interchangeably. Embodiments of the present invention are covered by both of the above terms as they are generally understood in the field. The terms "conductive via" and "micro via" both refer to structures for electrical connection of conductors at different interconnect levels of a multi-level substrate. These terms are sometimes used in the art to describe both an opening in an insulator in which the via structure will be completed, and the completed via structure itself. For purposes of this disclosure, via refers to the completed structure.

The present invention, in at least one embodiment, provides a thin, conformal, and high-integrity organic dielectric layer between conductive layers of a multilayered substrate material that is free from pin holes and step coverage problems to reduce loop inductance between the conductive layers. This is accomplished, in this embodiment, by using an electrocoating process to form the organic dielectric layer over the substrate material.

Overview of Electrocoating

Electrocoating is a method of organic finishing that uses an electric current field to deposit organic material onto a substrate material. The process works on the principle of "Opposites Attract." The fundamental physical principle of electrocoating is that materials with opposite electrical charges attract. An electrocoat system applies a direct-current (DC) charge to a substrate immersed in a bath of oppositely-charged organic dielectric particles. The organic dielectric particles drawn to the substrate are deposited onto the substrate, forming an even, continuous film over every surface, in every crevice and corner, until the organic dielectric coating reaches the desired thickness. This process leaves an organic dielectric layer that is free from pin holes and step coverage problems. Depending on the polarity of the charge, electrocoating is classified as either anodic or cathodic. In anodic electrocoating, the substrate material to be electrocoated is given a positive charge, and in cathodic electrocoating, the substrate material to be electrocoated is given a negative charge. In general, electrocoating offers the ability to coat complex surfaces evenly and free of pin holes and step coverage problems. The electrocoating process can be easily automated to increase throughput capacity. The electrocoating process requires low energy and minimal maintenance. Also, the electrocoating process can be controlled by voltage adjustments. Once the substrate is deposited with the dielectric material, the deposition stops. The electrocoating process can be controlled to form coatings that are less than 30 microns. Also, the process yields a thin, conformal, high-integrity layer that is free from pin holes and step coverage problems, because the process has the ability to coat complex surfaces evenly. Currently, electrocoating is widely used in a variety of industrial market segments.

FIG. 1 shows a sectional view of one embodiment of a through-via-in-via structure 100 formed using a dielectric layer 110 in a substrate material 120 according to the teachings of the present disclosure. Through-vias, also known as plated-through holes, or PTHs, are vias that provide conduction from one side to another side of a circuit board or a multilayer organic substrate. Through-vias are generally drilled through the circuit board or multilayer organic substrate including material such as fiber reinforced polymer. The pitch of the through-vias is generally limited by a wall thickness requirement of 140 microns or more. This pitch and wall thickness limitation can result in a significant contribution to the loop inductance of the power delivery circuit. An alternative design, known as via-in-via, or a coaxial via, shown in FIG. 1, provides another approach for routing both power and ground signals from one side of the substrate to the other. In this design shown in FIG. 1, a second, smaller diameter through-via is formed in the center of a larger through-via. This provides a power supply and ground return path that are much closer together than in a conventional through-via design, thus lowering inductance. In a conventional via-in-via, power and ground plane separation is generally 75 microns or more.

As depicted in FIG. 1, a dielectric layer 110 is formed between first and second conductive layers 130 and 140, respectively, in the through-via-in-via structure 100 of the substrate material 120. Also shown in FIG. 1 is an unfilled portion left in the via 100 by the second conductive layer 140, and an optional filler material 150 disposed in the unfilled portion of the through-via a 100 such that the optional filler material 150 overlies the second conductive material 140.

The dielectric layer 110 shown in FIG. 1 is formed using an electrocoating process. The thickness of the dielectric layer formed in the through-via-in-via structure 100 using the electrocoating process can be less than about 30 microns. The dielectric layer 110 formed using the electrocoating process is a thin, conformal, high-integrity coating that is free from pin holes and aspect ratio problems to prevent bridges and electrical shorts. In some embodiments, the dielectric layer 110 reduces loop inductance between first and second conductive layers 130 and 140. Respectively, when they are connected to power and ground planes.

By electrocoating the dielectric layer 110 on the first conductive layer 130 in the through-via 100, the dielectric layer 110 is aligned to the first conductive layer 130. The second conductive layer 140 on the dielectric layer 110 is in conformal alignment with the dielectric layer 110. Thus, the electrocoating process permits a self-alignment feature, which is far more precise than any mechanical or laser drilling alignment capability. This self-alignment permits a very thin dielectric layer 110 between the first and second conductive layers 130 and 140, respectively, in the via-in-via structure.

Loop inductance primarily depends on geometrical factors. It is generally the same for different dielectrics. Loop inductance can be calculated for a through-via-in-via structure by using $$L=0.2U_r Ln(r_2/r_1)$$

where $U_r$ is the permeability and $r_2$ and $r_1$ are outer and inner radii, respectively, of a self-aligned via-in-via structure. The following table illustrates some examples of computed inductance (pH/via) for coax self-aligned wires and self-aligned via-in-via cases. It can be seen from the following table that the loop inductance critically depends on the difference in length (separation) between the outer and inner radii.

| Outer Wire Radius ($r_2$) in micrometers | Inner Wire Radius ($r_1$) in micrometers | Dielectric thickness in micrometers | Inductance (pH/via) |
| --- | --- | --- | --- |
| 350 | 100 | 250 | 200.4 |
| 350 | 349 | 1 | 0.46 |
| 350 | 349.5 | 0.5 | 0.23 |

The registration accuracy using conventional double-drilling processes, such as mechanical or laser drilling, to form a via-in-via structure, can be generally more than 20 microns. Thus, the loop inductance obtained in the via-in-via structures can be several orders of magnitude higher than the coax self-aligned wires. A conventional double-drilling process generally includes filling a plated via with a dielectric material, and subsequently removing a portion of the dielectric material by drilling an opening through the dielectric material to form the second electrode. This subsequent drilling results in double-drilling of the via. Due to the inherent tolerances present in the mechanical or laser drilling operations, the registration accuracy (centering accuracy of the two drilling operations in the via) is generally more than 20 microns, thus limiting the minimum thickness to greater than 20 microns plus the thickness of the dielectric material required to prevent electrical shorts. Therefore, the final thickness of the deposited dielectric layer using a conventional double-drilling process can add up to be more than 75 to 100 microns. A The dielectric process described in the present disclosure eliminates the need for the second drilling operation by forming a thin, conformal, high-integrity dielectric layer 110 over the first conductive layer 130 that is less than 30 microns in thickness. This leaves a portion of the through-via unfilled to form the second electrode. Also, the dielectric process permits more control over the formation of the ultimate thickness of the dielectric layer 110, thus permitting a higher control over the ultimate loop inductance between the conductive layers in the substrate material 120.

In some embodiments, the dielectric layer 110 is formed using high dielectric constant materials made from organic polymers and/or organic polymer mixtures such as epoxy, epoxy-acrylate, and polyimide. The organic polymers and/or organic polymer mixtures used in the dielectric layer can be modified to vary material properties such as physical, mechanical, and chemical properties. For example, material properties can include properties such as modulus, elongation, adhesion, glass transition temperature, etch resistance, solvent resistance, Poisson's ratio, and coefficient of thermal expansion (CTE).

The expression "high dielectric constant material," refers to a material having a dielectric constant greater than oxides of silicon. In some embodiments, the dielectric constant is in the range of about 750 to 1000. The polymer dielectrics of embodiments of the present invention may have high dielectric constants and may comprise easily polarizable chemical species. The polymer dielectrics of embodiments of the present invention comprise a polymeric structure and a metal ion held within the polymeric structure by physical and chemical bonds. The polymer dielectrics of embodiments of the present invention are a substantial improvement over high dielectric ceramics and polymer/ceramic blends. High dielectric ceramics require a high temperature firing. The polymer dielectrics of embodiments of the present invention do not require a high temperature firing. Ceramic blends are limited in flexibility because of the particulate-based structure. Particles limit flexibility by limiting the thinness of the structure. The polymer dielectrics are not particulate-based. As a consequence, lower film thicknesses are not limited by the size of the particulate fillers and thinner layers of deposition may be fabricated, as compared to ceramic blend structures. The combination of using organic polymers with an electrocoating process yields a thinner layer deposition on a substrate material than what is possible with current fabrication techniques. The organic polymers used in embodiments of the present invention are shapable to form articles such as films, sheets, disks, and other flat shapes that are particularly useful for forming dielectric layers in multilayer substrates including a through-via-in-via structure.

The substrate material 120 can be a multilayer printed circuit board formed from an organic substrate supporting a plurality of insulated conductive trace layers. The first and second conductive layers 130 and 140, respectively, may be deposited using conventional electroplating processes such as electroless or electrolytic plating. In some embodiments, the first and second conductive layers 130 and 140, respectively, are electroplated using conductive materials such as copper, nickel, gold, and silver. The conductive materials provide signal paths for coupling or interconnecting electrical circuitry. The optional filler material 150 disposed in the unfilled portion of the through-via 100 can be a plugging material made from a polymer or silica-filled epoxy, as is known in the art.

Figure 2:
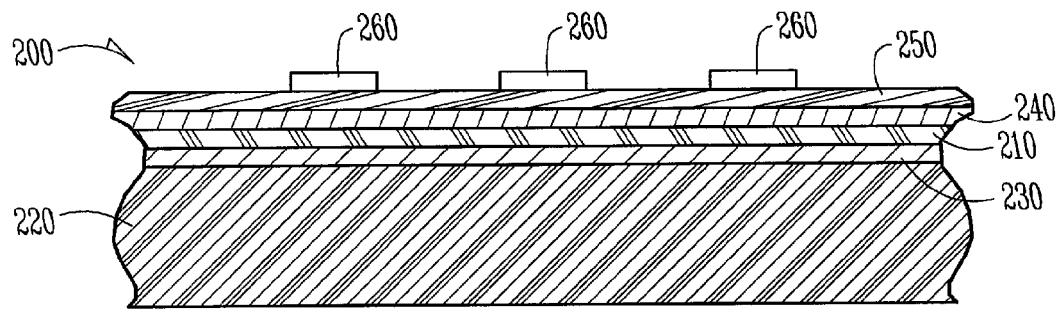
FIG. 2 shows a sectional view of one embodiment of a dielectric layer formed on a portion of a substrate material.

FIG. 2 shows a sectional view 200 of one embodiment of dielectric layer 210 formed on a portion of substantially planar substrate material 220. The dielectric layer 210 is formed between a first conductive layer 230 and a second conductive layer 240. The dielectric layer can also be formed on non-planar surfaces such as concave, convex or stepped surfaces. As shown in FIG. 2, the sectional view 200 shows the first conductive layer 220 formed on the planar substrate material. The second conductive layer 240 is disposed across from the first conductive layer 230, and on the dielectric layer 210. The dielectric layer 210 is formed using the electrocoating process described with reference to FIG. 1. The thickness of the dielectric layer 210 formed is less than about 30 microns to reduce loop inductance between the first and second conductive layers 230 and 240 when used as power and ground planes. The dielectric layer 210 formed using the electrocoating process is free from pin holes and step coverage problems to prevent bridging and shorting between first and second conductive layers 230 and 240 when the first and second conductive layers 230 and 240 are used as power and ground planes. In some embodiments, the dielectric layer is formed using high dielectric organic polymers and organic polymer mixtures such as epoxy, epoxy-acrylate, and polyimide. Insulating layer 250 shields conductive circuit traces 260 from the power and voltage planes, and conductive circuit traces 260 form part of an electric circuit linking various electrical components.

Figure 3:
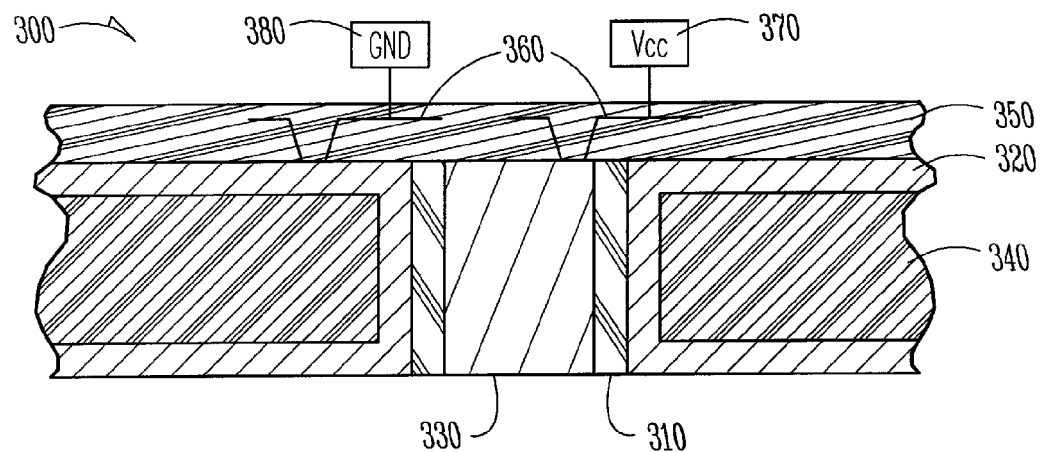
FIG. 3 is a sectional view of an embedded capacitor formed with a dielectric layer according to an embodiment of the present invention.

FIG. 3 is a sectional view of one embodiment of an embedded capacitor 300 having a dielectric layer 310 between a first conductive layer 320 and a second conductive material 330 in a substrate material 340. The dielectric layer 310 in the embedded capacitor 300 is formed using the electrocoating process described in detail with reference to FIG. 1 to attain a thin, conformal, high-integrity coating to reduce loop inductance between the first conductive layer 320 and the second conductive material 330. In some embodiments, the thickness of the dielectric layer 310 formed using the electrocoating process can be less than about 30 microns in thickness. In some embodiments, the first conductive layer 320 and the second conductive material 330 can be first and second electrodes of the embedded capacitor 300. In some embodiments, the first and second electrodes can be power and ground electrodes.

The dielectric layer 310 of the embedded capacitor 300 is formed using high dielectric constant materials such as organic polymers and/or organic polymer mixtures. It can be envisioned that the embedded capacitor 300 can include multiple layers of the dielectric layer 310 separated by multiple first and second electrodes to increase the capacitance of the embedded capacitor 300. The first conductive layer 320 can be formed using a conventional electroplating process. In some embodiments, the first conductive material 320 is electroplated using conductive materials such as copper, nickel, silver, and gold as conductors that provide signal paths for coupling or interconnecting electrical circuitry. The second conductive material 330 can be a conductive polymer or a conductive paste. The embedded capacitor 300 can include one or more micro vias 360 to bring the first conductive layer 320 and the second conductive material 330 to the top of a protective outer layer 350 formed on the substrate material 340. In some embodiments, the micro vias 360 can be connected to ground and power planes 380 and 370, respectively. In these embodiments, the loop inductance between the ground and power planes 380 and 370, respectively, is considerably reduced by the formed dielectric layer 310 using the electrocoating process described in the present disclosure.

Figure 4:
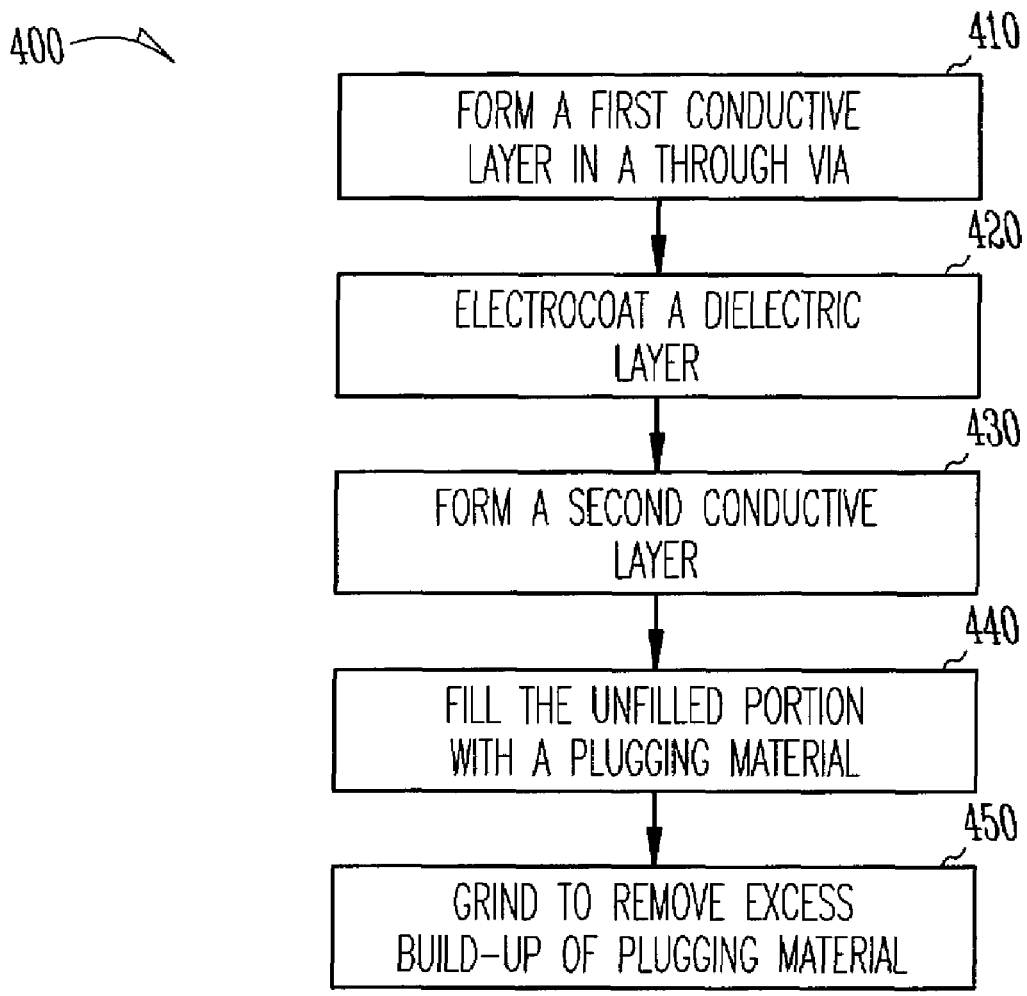
FIG. 4 is a flow diagram of an exemplary method of forming a dielectric layer in a self-aligned through-via-in-via structure according to an embodiment of the present invention.

FIG. 4 is a flow diagram illustrating generally a method 400 of forming a dielectric layer in a self-aligned through-via-in-via structure. Method 400, as shown in FIG. 4, begins with action 410 of forming a first conductive layer on the sidewall of a through-via in an organic substrate material. The through-via in the substrate material can be formed using a mechanical or laser drilling process. The substrate material can include more than one layer such as a multilayer printed circuit board. The first conductive layer can be electroplated using conventional processes such as electroless or electrolytic plating. The first conductive layer is electroplated using conductive materials such as copper, nickel or gold as conductors that provide signal paths for coupling or interconnecting electrical circuitry.

The next action 420 includes forming a dielectric layer over the first conductive layer such that the formed dielectric layer leaves a portion of the through-via unfilled. The dielectric layer is formed using the electrocoating process described in detail with reference to FIG. 1. In some embodiments, the thickness of the dielectric layer formed using the electrocoating process is less than about 30 microns. The dielectric layer formed using the electrocoating process is a thin, conformal, high-integrity layer that is free from pin holes and step coverage problems, that prevents the formation of bridges and electrical shorts. In some embodiments, the dielectric layer is formed using high dielectric constant materials made from organic polymers and/or organic polymer mixtures such as epoxy, epoxy-acrylate, and polyimide. The organic polymers and/or organic polymer mixtures used in the dielectric layer can be modified to vary material properties such as modulus, elongation, adhesion, and glass transition temperatures.

The next action 430 can include filling the unfilled portion of the through-via with a second conductive materials, such that the electrocoated thin dielectric layer provides a low loop inductance between the first conductive layer and the second conductive material when the first conductive layer and the second conductive material are used as power and ground planes. In some embodiments, the second conductive layer is a conductive material such as a conductive polymer or a solder paste.

Action 430 can include forming a second conductive layer over the formed dielectric layer such that the formed thin dielectric layer provides a low loop inductance between the formed first and second conductive layers when the first and second conductive layers are used as ground and power planes. Also, the formed second conductive layer can leave a portion of the through-via unfilled. The second conductive material can be formed with conductive materials described with reference to action 410.

The next action 440 can include filling the remaining portion of the plate through-via with a plugging material. The plugging material can be a conductive or non-conductive material. In some embodiments, the plugging material is a silica-filled epoxy. The optional action 450 includes grinding to remove excess build up of the filled plugging material.

Figure 5:
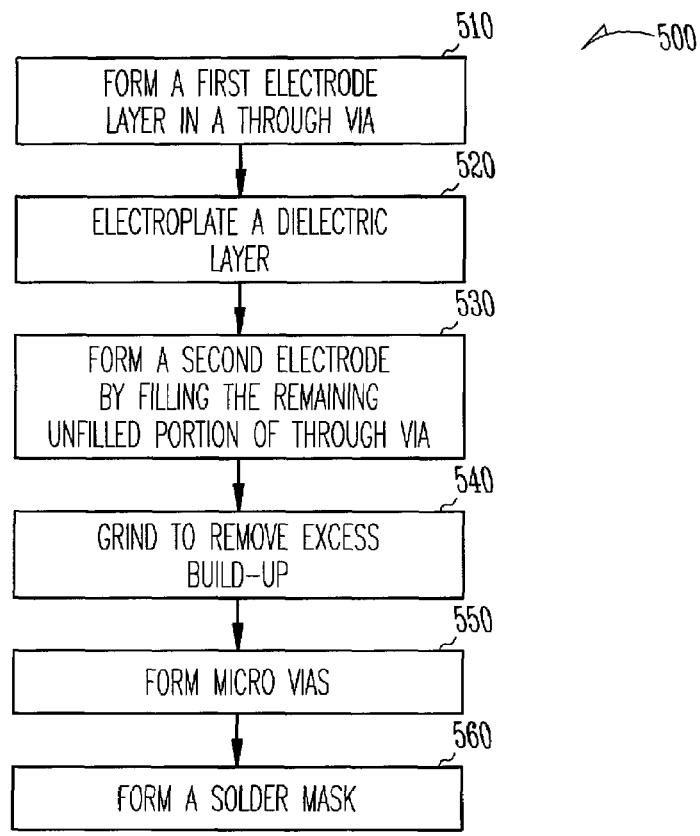
FIG. 5 is a flow diagram of an exemplary method of forming a dielectric layer in an embedded capacitor according to an embodiment of the present invention.

FIG. 5 is a flow diagram illustrating generally a method 500 of forming a dielectric layer in an embedded capacitor. Method 500, as shown in FIG. 5, begins with action 510 of forming a first electrode on the sidewall of a through-via in an organic substrate material. The through-via in the substrate material can be formed using a mechanical or laser drilling process. The substrate material can include more than one layer such as a multilayer printed circuit board. The first electrode can be electroplated using conventional processes such as electroless or electrolytic plating. The first electrode is electroplated using conductive materials such as copper, nickel or gold as conductors that provide signal paths for coupling or interconnecting electrical circuitry.

The next action 520 includes electrocoating a dielectric layer over the first electrode layer such that a portion of the through-via is left unfilled. The dielectric layer is formed using the electrocoating process described in detail with reference to FIG. 1. In some embodiments, the thickness of the dielectric layer formed using the electrocoating process is less than about 30 microns. The dielectric layer formed using the electrocoating process is a thin, conformal, high-integrity layer that is free from pin holes and step coverage problems, that prevents the formation of bridges and electrical shorts. In some embodiments, the dielectric layer is formed using high dielectric constant materials made from organic polymers and/or organic polymer mixtures such as epoxy, epoxy-acrylate, and polyimide. The organic polymers and/or organic polymer mixtures used in the dielectric layer can be modified to vary material properties such as physical, mechanical, and chemical properties. For example, the physical, mechanical, and chemical properties can include material properties such as modulus, elongation, adhesion, glass transition temperature, etch resistance, solvent resistance, Poisson's ratio, dielectric constants, and CTE.

The next action 530 includes forming a second electrode by filling the remaining unfilled portion of the through-via with a conductive materials such that the formed dielectric layer provides a low loop inductance between the first and second electrodes.

Action 530 can include forming a second electrode layer over the electrocoated dielectric layer such that the second electrode layer leaves a portion of the through-via unfilled so that a third and fourth electrodes including a second electrocoated layer can be formed in the unfilled portion of the through-via so that the capacitance of an embedded capacitor can be increased. It can be envisioned that multiple layers of electrodes including the electrocoated dielectric layers can be formed to increase capacitance of the embedded capacitor. The electrocoating process described in the present disclosure forms a thin, conformal coating that makes it possible to have multiple layers in the embedded capacitor.

The next action 540 can include removing excess build up of the filled conductive material outside the through-via. The next action 550 can include forming micro vias to connect the formed first and second electrodes to structure outside the substrate material. The next action 560 can include forming a solder mask over the formed micro vias.

Figure 6:
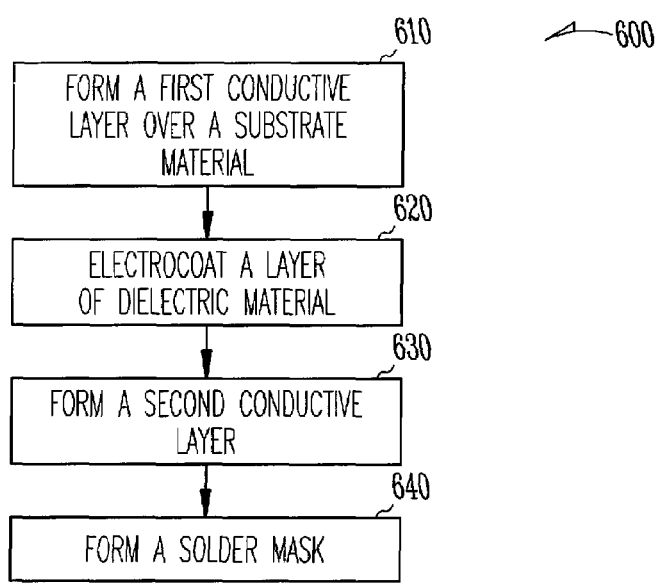
FIG. 6 is a flow diagram of an exemplary method of forming a dielectric layer on a substantially planar substrate material according to an embodiment of the present invention.

FIG. 6 is a flow diagram illustrating generally a method 600 of forming a dielectric layer on a substantially planar substrate material. Method 600, as shown in FIG. 6, begins with action 610 of forming a first conductive layer on the substantially planar substrate material. The substrate material can include more than one layer such as a multilayer printed circuit board. The first conductive layer can be electroplated using conventional processes such as electroless or electrolytic plating. The first conductive layer is electroplated using conductive materials such as copper, nickel, silver, and gold as conductors that provide signal paths for coupling or interconnecting electrical circuitry.

The next action 620 includes electrocoating a dielectric layer over the formed first conductive layer. In some embodiments, the thickness of the dielectric layer formed using the electrocoating process is less than about 30 microns. The dielectric layer formed using the electrocoating process is a thin, conformal, a high-integrity layer that is free from pin holes and step coverage problems, and that prevents the formation of bridges and electrical shorts. In some embodiments, the dielectric layer is formed using high dielectric constant materials made from organic polymers and/or organic polymer mixtures such as epoxy, epoxy-acrylate, and polyimide. The organic polymers and/or organic polymer mixtures used in the dielectric layer can be modified to vary material properties such as modulus, elongation, adhesion, and glass transition temperatures.

The next action 630 includes forming a second conductive layer over the electrocoated dielectric layer, such that the dielectric layer provides a low loop inductance between the first and second conductive layers when used as ground and power planes. The second conductive layer can be formed using similar materials used in forming the first conductive layer described with reference to action 610. The next action 640 can include forming a solder mask over the formed second conductive layer.

The above-described method and apparatus provide, among other things, a thin, conformal, and high-integrity organic dielectric layer between conductive layers of a multilayered substrate material that is free from pin holes and step coverage problems, to reduce loop inductance between the conductive layers in a multilayered organic substrate to improve shielding and signal integrity.

It is to be understood that the above description is intended to be illustrative, and not restrictive. Many other embodiments will be apparent to those of skill in the art upon reviewing the above description. The scope of embodiments of the invention should, therefore, be determined with reference to the appended claims, along with the full scope of equivalents to which such claims are entitled.

What is claimed:

1. An article of manufacture, comprising:
   a substrate;
   a hole through the substrate, a portion of the surface of the substrate surrounding the hole plated with a first conductive material;
   a dielectric layer formed over the first conductive material in the through hole and defining a smaller through hole coaxially aligned with the through hole; the dielectric layer comprising high dielectric constant material;
   a conductor formed of a second conductive material in the smaller through hole; and
   an insulating layer formed over the hole and at least a portion of the first conductive material; and having at least two microvias formed therein, one of the microvias electrically coupled to the first conductive material with which the through hole is plated and another of the microvias electrically coupled to the conductive material in the smaller through hole;
   one of the first and second conductive materials coupled to a ground layer of the article, and the other of the first and second conductive materials connected to a voltage supply layer of the article, to form a capacitor coupling the ground layer and voltage supply layer.

2. The article of claim 1, wherein the first conductive material comprises one or more electrically conductive materials selected from the group consisting of copper, nickel, gold, and silver.

3. The article of claim 1, wherein the high dielectric constant material comprises one or more organic materials selected from the group consisting of organic polymers, polymer mixtures, epoxies, epoxy acrylates, and polyimides.

4. The article of claim 1, wherein the second conductive material is a silica-filled epoxy or a silica-filled polymer.

5. An electrical device, comprising:
   a substrate having an electrical circuit thereon with one or more conductive traces connected to the electrical circuit;
   a hole though the substrate;
   a ground plane conductive layer formed above the substrate and on a wall of the hole and connected to one of the conductive traces;
   a layer of high dielectric insulating material electrodeposited on the portion of the ground plane layer on the wall of the hole and defining a smaller hole; and
   a conductive material formed in the smaller hole and connected to a power source layer and to one of the conductive traces, forming a capacitor coupling the ground plane and power source layer.

6. The device of claim 5, wherein the high dielectric constant material comprises one or more organic materials selected from the group consisting of organic polymers, polymer mixtures, epoxies, epoxy acrylates, and polyimides.

7. The device of claim 5, wherein the conductive material formed in the smaller hole is silica-filled epoxy or polymer.

8. The device of claim 5, wherein the conductive material formed in the smaller hole is a conductive paste material.

9. The device of claim 5, wherein the conductive material formed in the smaller hole comprises a silica filled epoxy.

10. The device of claim 5, wherein, wherein the thickness of the layer of high dielectric insulating material is less than about 30 microns.

* * * * *

UNITED STATES PATENT AND TRADEMARK OFFICE
CERTIFICATE OF CORRECTION

PATENT NO. : 7,348,496 B2
APPLICATION NO. : 11/003956
DATED : March 25, 2008
INVENTOR(S) : Wermer et al.

It is certified that error appears in the above-identified patent and that said Letters Patent is hereby corrected as shown below:

In column 10, line 31, in Claim 5, delete "though" and insert -- through --, therefor.

In column 10, line 52, in Claim 10, after "claim 5," delete "wherein,".

Signed and Sealed this

Twenty-ninth Day of July, 2008

JON W. DUDAS
*Director of the United States Patent and Trademark Office*